United States Patent [19]
Wright et al.

[11] Patent Number: 6,118,637
[45] Date of Patent: Sep. 12, 2000

[54] PIEZOELECTRIC ASSEMBLY FOR MICROPOSITIONING A DISC DRIVE HEAD

[75] Inventors: John S. Wright, Bloomington; Jeffrey K. Berkowitz, Carver; Lanshi Zheng, Eden Prairie, all of Minn.

[73] Assignee: Seagate Technology, Inc., Scotts Valley, Calif.

[21] Appl. No.: 09/123,784

[22] Filed: Jul. 28, 1998

Related U.S. Application Data

[60] Provisional application No. 60/072,292, Jan. 8, 1998.

[51] Int. Cl.$^7$ .............................. G11B 21/21; G11S 5/55
[52] U.S. Cl. ................................... 360/294.4; 360/245.3
[58] Field of Search .............................. 360/78.05, 104, 360/105, 106, 109, 294.4, 245.3

[56] References Cited

U.S. PATENT DOCUMENTS

| | | | |
|---|---|---|---|
| 5,021,907 | 6/1991 | Zak | 360/104 |
| 5,079,659 | 1/1992 | Hagen | 360/104 |
| 5,225,950 | 7/1993 | Crane | 360/104 |
| 5,233,256 | 8/1993 | Hayashi et al. | 310/317 |
| 5,333,085 | 7/1994 | Prentice et al. | 360/104 |
| 5,493,463 | 2/1996 | Hagen | 360/104 |
| 5,612,841 | 3/1997 | Johnson | 360/104 |
| 5,712,748 | 1/1998 | Masse | 360/104 |
| 5,856,896 | 1/1999 | Berg et al. | 360/104 |
| 5,898,541 | 4/1999 | Boutaghou et al. | 360/109 |
| 5,920,441 | 7/1999 | Cunningham et al. | 360/78.05 |
| 5,920,978 | 7/1999 | Koshikawa et al. | 29/603.12 |
| 5,929,326 | 7/1999 | Imaino et al. | 73/105 |
| 5,943,189 | 8/1999 | Boutaghou et al. | 360/103 |
| 5,963,396 | 10/1999 | Burga et al. | 360/103 |

FOREIGN PATENT DOCUMENTS

| | | |
|---|---|---|
| 6-120578 | 4/1994 | Japan . |
| 6-208771 | 7/1994 | Japan . |
| 7-192237 | 7/1995 | Japan . |
| 7-296537 | 11/1995 | Japan . |

OTHER PUBLICATIONS

V.D. Kugel et al., "A Comparative Analysis of Piezoelectric Bending–mode Actuators", *SPIE*, vol. 3040, 70–80, 1997.

P. Gaucher, "Piezoelectric and Electrostrictive Bimorph Actuators and Sensors", *Third ICIM/ECSSM*, pp. 610–615; 1996.

"Piezoelectric Technology Data for Designers", *Morgan Matroc Inc.*, pp. 1–5.

"TP–237 Some Design Considerations in the Use of Bimorphs as Motor Transducers", *Morgan Matroc Inc.*, pp. 1–16.

"TP–223 Useful relationships for Ceramic Bender Bimorphs", *Morgan Matroc Inc.*, pp. 1–11.

M. R. Steel et al., "The Piezoelectric Bimorph: An Experimental and Theoretical Study of its Quasistatic Response", *J. Phys. D: Appl. Phys.*, vol. 11, pp. 979–989, 1978.

A.J. Moulson et al., "Electroceramics", *Chapel & Hall*, pp. 296–303, 1990.

"Narrow 2–Layer Piezoelectric Motor or Generator Element", *Piezo Systems, Inc.*, p. 40.

*Primary Examiner*—Jefferson Evans
*Attorney, Agent, or Firm*—Fish & Richardson P.C.

[57] ABSTRACT

An assembly and method for micropositioning a disc drive head is described. An implementation of the assembly includes a gimbal, a piezoelectric element bonded to the gimbal and electrically connected to a voltage source, and a slider connected to the piezoelectric element. The assembly may also include at least a second piezoelectric element bonded to the gimbal and connected to the slider. The piezoelectric elements may be made of PZT material, and each may be in a monomorph or bimorph configuration.

16 Claims, 4 Drawing Sheets

PIEZOELECTRIC ASSEMBLY FOR MICROPOSITIONING A DISC DRIVE HEAD

Priority is claimed from U.S. provisional application Ser. No. 60/072,292 filed on Jan. 8, 1998.

BACKGROUND OF THE INVENTION

The invention pertains to the use of a microactuator for micropositioning a disc drive head.

Disc drives are information storage devices that use thin film magnetic media to store data. A typical disc drive includes one or more rotatable discs having concentric data tracks wherein data is read or written. As the disc rotates, a transducer (also known as a "head") is positioned by an actuator to magnetically read data from, or write data to, the various tracks on the disk.

Conventionally, the transducer is attached to a slider having an air bearing surface which is supported adjacent the data surface by a cushion of air generated by the rotating disc. Wires typically connect the transducer on the slider to the disc file read/write electronic circuitry.

The slider is attached on the side opposite the air bearing surface to a suspension assembly, and the suspension assembly is attached to a support arm of a transducer positioning actuator. The slider is maintained in close proximity to, but out of contact with, the data surface of the disc. The suspension assembly provides dimensional stability between the slider and the actuator arm, provides controlled flexiblity in pitch and roll motion of the slider relative to the direction of motion on the rotating disc, and provides resistance to yaw motion.

A load or force is typically applied against the slider by a load beam, and the force is compensated by the cushion of air between the slider air bearing surface and the rotating disc. A gimbal element attached to the load beam is typically attached to the slider by an epoxy binding. The gimbal resiliently supports the slider and allows it to pitch and roll as the slider rides on the cushion of air as it follows the topography of the rotating disc.

In order to accurately read or write data to a disc, the magnetic head must remain closely aligned with the particular track being accessed. As track pitches in the disc drive industry approach 15,000–25,000 tracks per inch, the conventional transducer positioning actuator will be unable to precisely and accurately position the transducer in a specific track on the disc drive.

SUMMARY OF THE INVENTION

In general, an actuator assembly and method for micropositioning a disc drive head is presented. In an implementation, the assembly includes a piezoelectric element which is bonded to a gimbal and electrically connected to a voltage source. A slider is connected to the piezoelectric element.

In general, in another aspect, the invention includes at least a second piezoelectric element bonded to the gimbal and connected to the slider.

Other embodiments may include one or more of the following features. Each piezoelectric element may be made of PZT. In addition, the piezoelectric element may be in a monomorph configuration, wherein a layer of PZT may be bonded to a metal layer. Alternately, the piezoelectric element may be a bimorph having an inner electrode sandwiched between a first layer and a second layer of PZT. The first and second PZT layers of the bimorph may be polled in opposite directions, or may be polled in the same direction. The piezoelectric element may also include a first outer electrode connected to the first layer of PZT and a second outer electrode connected to the second layer of PZT in an offset configuration, to permit a two wire connection.

In some implementations, the piezoelectric element may be in a beam configuration having a first end and a second end of a first edge connected to the slider. The approximate middle of the second edge of the piezoelectric element may be connected to the gimbal.

In general, in another aspect, the invention is a method for producing an assembly for micropositioning a disc drive head, including the steps of manufacturing at least one piezoelectric actuator to have dimensions to fit between a slider and a gimbal; connecting a first edge of the piezoelectric actuator to the slider; and connecting a second edge of the piezoelectric actuator to the gimbal. Another implementation may include connecting at least a second piezoelecric actuator to the slider and to the gimbal.

Other embodiments of the method may include one or more of the following features. The technique may include connecting a portion near a first end and a second end of the first edge of the piezoelectric actuator to the slider, and connecting a portion near the approximate middle of the second edge to the gimbal. The manufacturing step may include creating a piezoelectric structure for producing a plurality of microactuators by processing bulk PZT material into first and second layers of PZT tape; screen printing electrodes onto the first layer of PZT tape; and laying the second layer of PZT tape on top of the electrode layer. The entire structure may then be fired to remove organic materials and to densify the structure. In addition, the layers of PZT material may be polled, and the structure may be diced to create microactuators of a desired size and shape.

Another implementation may include the further steps of patterning first and second outer layers of electrodes; connecting the first outer electrode layer to the first layer of PZT tape; and connecting the second outer electrode layer to the second layer of PZT tape.

The invention offers a simple, low-voltage piezoelectric actuator assembly for micropositioning a disc drive head. The use of thin layers of PZT in the actuator permits the application of a high field with a low voltage to generate the movement required to accurately position the head in a track on the disc.

Other advantages and features will become apparent from the drawings and the following detailed description.

BRIEF DESCRIPTION OF THE DRAWINGS

Like reference numbers and designations in the various drawings indicate like elements.

DETAILED DESCRIPTION

Figure 1:
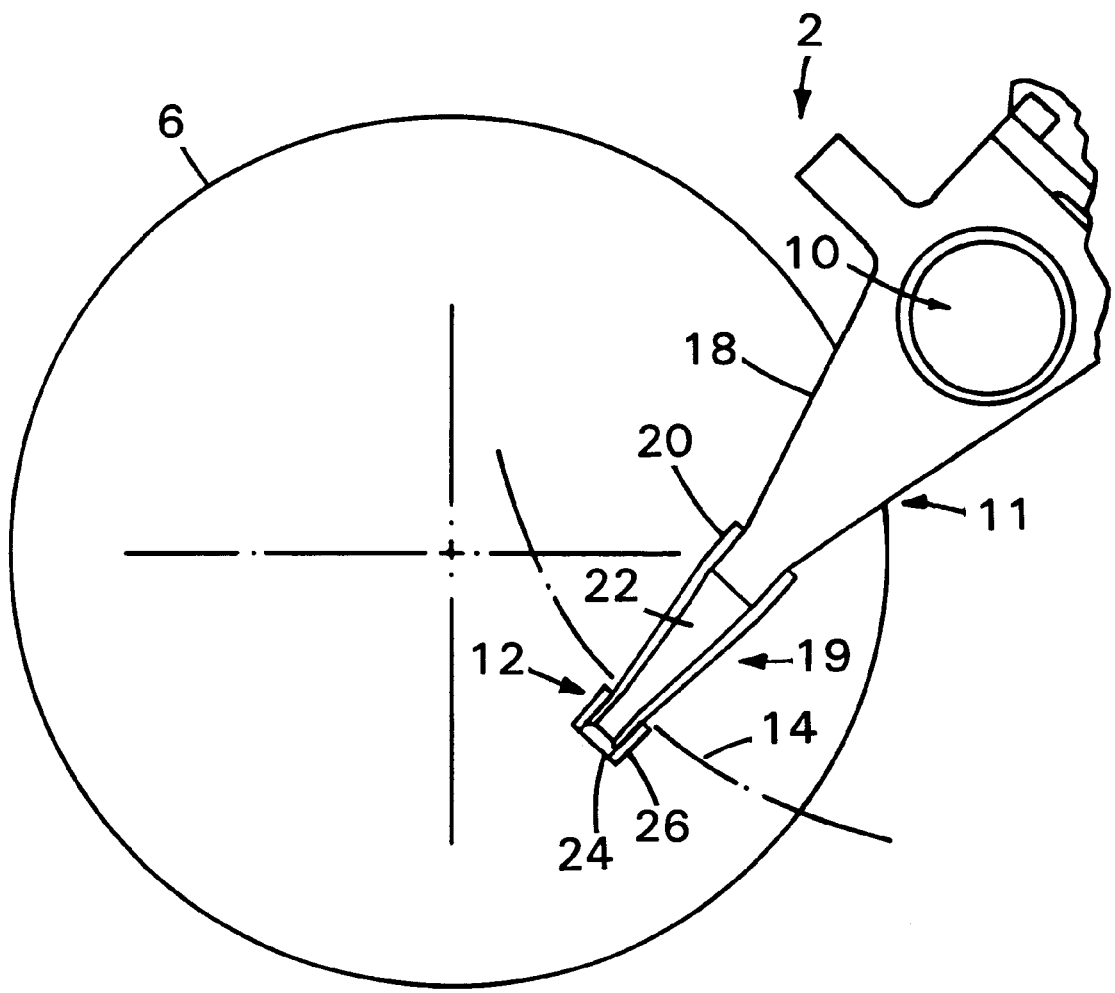
FIG. 1 illustrates an implementation of an actuator arm assembly.

FIG. 1 illustrates an implementation of an actuator arm assembly 2. An actuator 10 is attached to a rotary actuator arm 11 that supports a slider-suspension assembly 12. The actuator 10 causes the rotary actuating arm 11 to move along an arc 14 over a magnetic disc 6 to position a slider 26. The arm 11 may include a supporting arm 18, and a suspension 19. The suspension 19 may include a base plate 20 and a load beam 22. The load beam 22 provides a spring action to bias the slider 26 toward the disc 6. The suspension 19 is electrically connected to the arm 11 which is electrically connected to electrical ground, i.e., typically to the chassis (not shown), in a manner known in the art.

Figure 2:
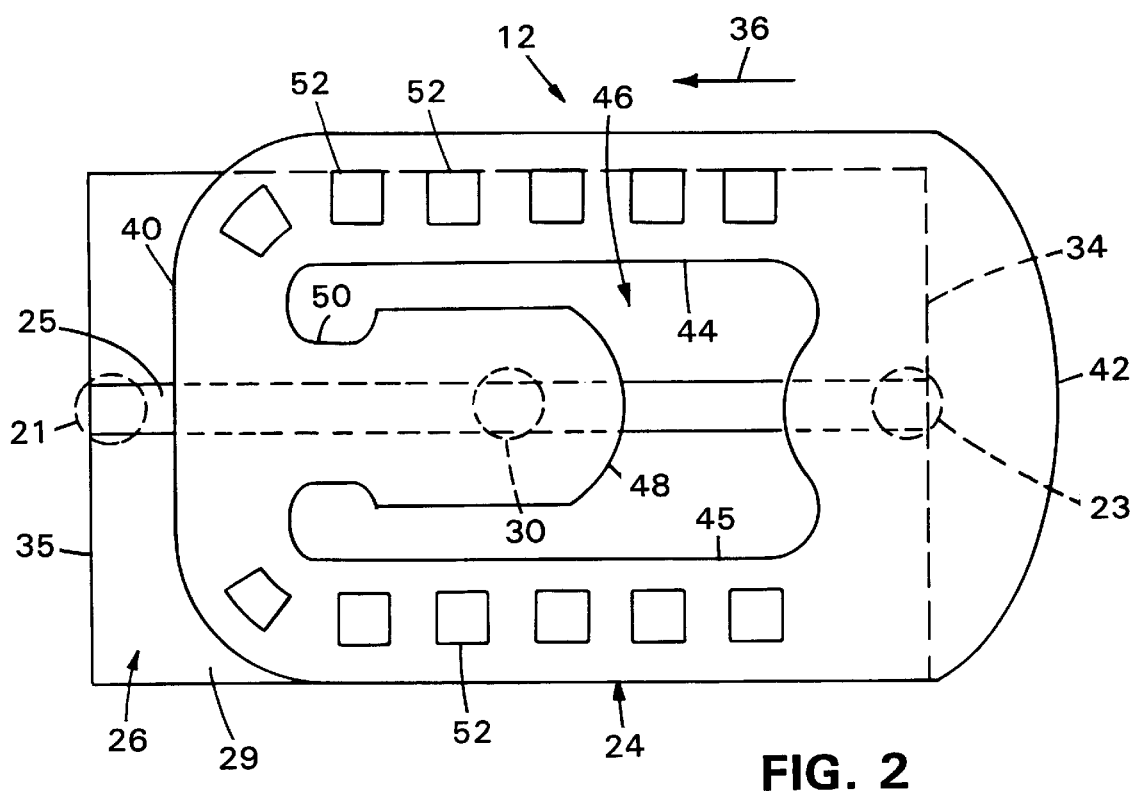
FIG. 2 is an enlarged top view of a slider suspension assembly according to the invention.

FIG. 2 is an enlarged top view of the slider-suspension assembly 12 according to the invention, as shown in FIG. 1 but with the load beam 22 removed for clarity. The illustrated implementation includes a slider 26 which may be formed of a ceramic material such as a mixture of Alumina ($Al_2O_3$) and titanium carbide (TiC). The slider 26 has a backside 29 that is generally planar with generally perpendicular edges including the leading edge 34 and trailing edge 35, taken with reference to the direction of the rotation of the disc (shown as arrow 36). Typically, the transducers (not shown) are located on the trailing edge 35 of the slider 26.

The gimbal 24 may be formed of 302/304 series stainless steel, and in the embodiment shown in FIG. 2 includes a trailing member 40, a leading member 42 and two struts 44 and 45. The struts 44 and 45 connect the trailing member 40 to the leading member 42 and define an open portion 46 therebetween. A support 48 extends into the open portion 46 and is connected to the trailing member 40 by a neck 50. A plurality of apertures, indicated generally at 52, may be etched into the struts 44, 45. In this implementation, the gimbal 24 may be between approximately 0.04932–0.080 inches (1.252–2.032 mm) in length (i.e. from trailing member 40 to leading member 42); and may be between approximately 0.0394–0.063 inches (1.001 and 1.600 mm) in width (i.e., as measured between the struts 44, 45).

A microactuator 25 is shown sandwiched between the slider 26 and the gimbal 24. The illustrated microactuator has a simple beam configuration, and is attached on its bottom to the backside 29 of the slider at its first end in dotted line area 21 and at its second end in dotted line area 23. The top side of the microactuator is connected to the gimbal support 48 in dotted line area 30, which is the approximate center of the microactuator. In an alternate implementation of the gimbal, the center area 30 of the microactuator may approximately correspond to the middle of the gimbal. The microactuator deforms in response to a change in the electric field to microposition a transducer connected to the trailing edge of the slider within one or two tracks of a position on the disc, and to allow track following.

A suitable actuator for micropositioning the transducer of a slider is a piezoelectric actuator. Piezoelectric actuators deform when an electric field is applied, and have both advantages and disadvantages when compared with electromagnetic and electrostatic actuators. Advantages include high force output, low current requirement resulting in low stray magnetic fields, simple implementation resulting in fewer processing steps (e.g., fewer steps than fabrication of micromachined electrostatic or electromagnetic actuators), and the ability to remain motionless without the application of a voltage or current. Disadvantages include high temperature processing, which dictates that the piezoelectric actuators may need to be separately processed, and displacement hysteresis. Consequently, high temperature processing may require attaching the piezoelectric actuator to the slider and to the gimbal after processing, and the hysteresis aspect requires using specialized circuitry (e.g., charge-feedback control circuitry) to compensate for the error in displacement caused by the hysteresis.

The most common material used for piezoelectric actuators is lead zirconate titanate, PZT ($Pb\{Zr_xTi_{1-x}\}O_3$, where x is approximately equal to 0.54), formed between the solid solution of lead zirconate, PZ ($PbZrO_3$), and lead titanate, PT ($PbTiO_3$). A number of designated types of PZT are available commercially, each having a specified set of properties, achieved through varying the Zr/Ti ratio and by adding dopants (such as Nb, Mn, Sr or La). Although alternatives to PZT exist, such as a solid solution between lead magnesium niobate, PMN ($PbMg_{1/3}Nb_{2/3}O_3$) and PT (e.g. 0.1PT-0.9PMN), which produce a larger strain, such alternatives typically are more expensive or have other disadvantages. A desirable type of PZT for purposes of making a microactuator is PZT-5H which has high piezoelectric coefficients, d.

Equation (1) below describes the strain, S, which develops along the length of an actuator as a result of an electric field applied in the thickness direction of a piezoelectric capacitor:

$$S_1 = s_{13}^E T_3 + s_{12}^E T_2 + s_{11}^E T_1 + d_{31} E_3 \tag{1}$$

where d has the units m/V, s is the elastic compliance ($m^2/N$) and T is the stress ($N/m^2$). The compliance and stress terms are a result of Hooke's laws, and may be disregarded in the case of no applied stress. Alternatively, d relates the charge to the electric displacement, D, which develops in response to an applied stress, given by the following:

$$D_3 = d_{31}(T_1 + T_2) + d_{33}T_3 + \epsilon_{33}E_3 \tag{2}$$

where d has the units C/N, and $\epsilon$ is the relative permittivity of the piezoelectric (C/Vm). In the above equations, $d_{33}$ is approximately equal to $-2d_{31}$.

The electric displacement may be thought of as the separation of positive and negative charges necessary to equal the internal field caused by the polar regions (domains) within the piezoelectric element. Dimensional analysis indicates that the two units have the same numerical value. It should be noted that the piezoelectric coefficients are described by a third rank tensor. Symmetry arguments may be used to reduce the number of independent coefficients.

Poling results in further simplification, and allows the piezoelectric coefficients to be written in matrix form. Poling is necessary to align the electric dipoles in PZT since, as formed, the electric dipoles in PZT are randomly oriented. By definition, when a field is applied across a parallel plate capacitor, the thickness direction is assigned the three-direction, with the one-direction commonly given to the larger of the in-plane dimensions. In a piezoelectric actuator, all dimensions will experience a strain, but since strain is the change in length with respect to the original length, $\Delta l/l$, the largest dimension will result in the largest change in length. For use in micropositioning a slider, the dimensions and design of the piezoelectric actuator determines the attainable actuation, or amount of movement.

Figure 3A:
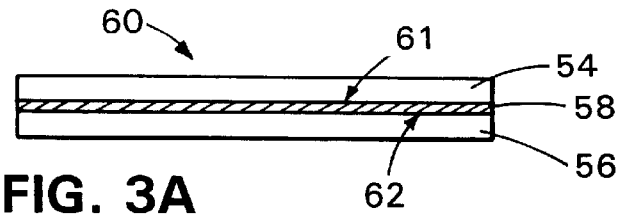
FIG. 3A illustrates a typical bimorph actuator configuration.
Figure 3B:
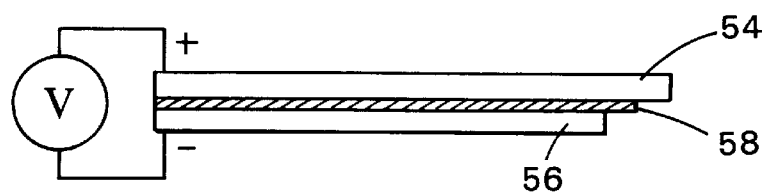
FIGS. 3B and 3C illustrate the application of a field and the resultant bending of the actuator of FIG. 3A.
Figure 3C:
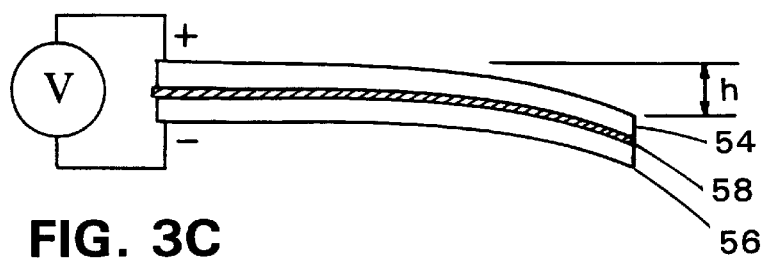

The implementation of a slider suspension assembly 12 according to the invention as shown in FIG. 2 utilizes a piezoelectric bimorph actuator. FIG. 3A illustrates a bimorph actuator configuration 60 which consists of two layers of PZT 54 and 56, attached with an internal electrode and/or neutral shim 58 in the center. The arrows 61 and 62 indicate the poling direction, which was determined during processing of the actuator. FIG. 3B illustrates the application of a field in the opposite sense as the poling direction in top layer 54 which induces the top layer to expand while inducing the bottom layer (which is oppositely poled in relation to the top layer) to contract. Since the two layers 54 and 56 are attached and do not strain appreciably in relation to each other, the bimorph actuator will bend as shown in FIG. 3C. Poling the two layers 54 and 58 in opposite directions is performed by connecting the center shim to ground and applying opposite fields to the respective layers.

The bimorph configuration shown in FIGS. 3A–3C is connected in series, and the deflection, h, at the end of the beam is given by the following relation:

$$h = \frac{3}{2} d_{31} \left(\frac{1}{t}\right)^2 V \quad (3)$$

where l is the length of the bimorph, t is the thickness (two layers plus center electrode), and V is the applied voltage. In order to provide the required amount of bending in a low voltage actuator, thin layers of PZT should be used.

Instead of a series configuration, the bimorph actuator may be connected in parallel, where the two PZT layers of the bimorph are poled in the same direction. To actuate a parallel configuration bimorph actuator, the center electrode/shim is grounded (negative power supply terminal), and each layer is connected to the positive terminal of a power supply. The resulting deflection is twice that of a comparable series connection bimorph actuator (since for a given voltage the parallel connection scheme results in twice the field). Operated as a simple beam (supported at both ends), the deflection is one quarter the cantilever deflection.

The following is an example calculation for a PZT-5H bimorph actuator in the simple beam configuration having dimensions of approximately 0.050"×0.004"×0.004" and connected in parallel, with an applied voltage of 72 VDC:

$$h = 2 \frac{1}{4} \frac{3}{2} d_{31} \left(\frac{1}{t}\right)^2 V = 0.75 \left(250 \times 10^{-6} \frac{um}{V}\right) \left(\frac{1270}{101.6}\right)^2 72 = 2.11 \text{ um}$$

The above calculation indicates a displacement of 2.11 μm is obtainable at the center of a piezoelectric bimorph actuator that has dimensions suitable for integration with a slider and gimbal, and that is connected in parallel in a simple beam configuration.

In order to generate the necessary actuation, a mechanical gain of the actuation available from the three types of actuation must be incorporated into the design of the piezoelectric actuator. The piezoelectric effect results in small strains, typically less than 0.1%, and restricting the drive voltage available to +36V (or ±12V) further limits the attainable piezoelectric strain (actuation). This limit in the voltage necessitates the use of thin piezoelectric actuators since the achievable strain is a function of the applied field, E (volt/thickness). The use of thin layers provides the opportunity to apply a high field with low voltage. The low strains coupled with the low voltage require a significant mechanical advantage scheme to be developed, while maintaining both a high force output and wide bandwidth. The force output is a function of the volume of the piezoelectric material, however, and thus trade-offs occur between actuation amount, size of the actuator and the voltage required.

The force output of the actuator must be greater than the blocking force, described as the force necessary to prevent actuation. Because the actuator must be integrated with either the slider or gimbal, the dimension (height and width) must be small, which will further limit the available force.

Figure 4:
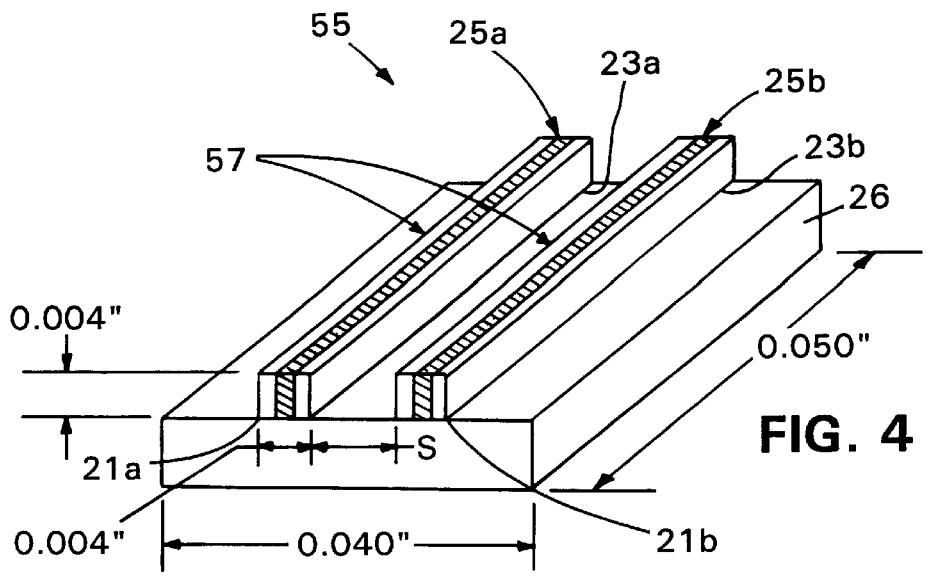
FIG. 4 illustrates an alternate implementation of a slider suspension assembly according to the invention.

An alternate implementation of a slider suspension assembly 55 is shown in FIG. 4. Two bimorph actuators 25a and 25b are connected on their first edges to the slider 26 at their first ends 21a and 21b, and at their second ends 23a and 23b, as shown. The use of two bimorph actuators provide stability for connection of the gimbal (not shown in FIG. 4), and provides additional volume for increased force. In the implementation of FIG. 4, the height, width and length of each bimorph actuator is approximately 0.004"×0.0041"×0.050" (measurements in inches), and the length and width of the slider is approximately 0.040"×0.050". The separation "s" between the bimorph actuators 25a and 25b depends upon the width of the gimbal support 48 (shown in FIG. 2). In this implementation, each bimorph actuator connects to the gimbal support on their second edges at their approximate center points 57. Connecting the bimorph actuators to the slider and gimbal adds 0.004" plus a glue thickness (of approximately 0.0005") to the z-height of the slider suspension assembly 12.

In FIG. 4 the first edges of the bimorph microactuators 25a and 25b may be connected to the slider 26 at the leading 34 and trailing 35 edges only (simple beam configuration) and connected at their second edges to the gimbal at their approximate mid-point, to maximize the bending of the bimorph in the plane of the top of the slider. A suitable epoxy to bond the piezoelectric bimorph actuators to the slider and to the gimbal is non-conductive and sold under the tradename Hysol material 9430NG by the Dexter Corp. of Seabrook, N.H.

Figure 5:
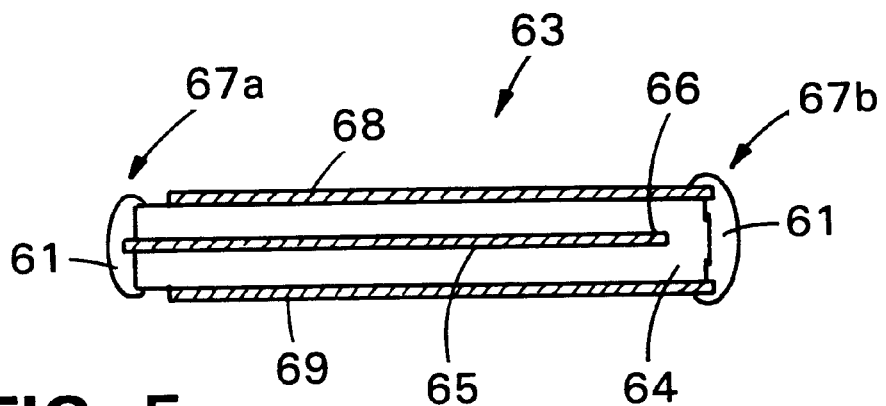
FIG. 5 illustrates an offset electrode bimorph microactuator assembly.

FIG. 5 illustrates an offset electrode bimorph microactuator configuration 63, which permits a two-wire connection to be used. A two-wire connection is desirable to minimize the number of wires used in the slider suspension assembly. A center electrode 65 extends to a first end 67a of the bimorph, with the center electrode's opposite end 66 terminating within the PZT material 64 at the other end 67b. The two outer electrodes 68 and 69 are also patterned so they extend to only the end 67b. This allows for conductive epoxy 61 to be applied freely to both ends, with the epoxy at end 67a making electrical contact with the center electrode 65 and the epoxy at the other end 67b making electrical contact with the outer electrodes 68 and 69. The conductive epoxy 61 may also be used to provide the mechanical attachment to the slider.

One technique for processing a bimorph actuator utilizes two pieces of bulk PZT, many times larger than the desired final dimension (thickness would be desired thickness), connected together with a conductive epoxy. The center electrode may be patterned, which may be carried out with screen printing, and a two-wire connection made to an actuator. Once attached, the outer electrodes could be deposited by an appropriate method (sputtering, evaporation, plating, etc.). Standard photolithographic techniques could then be used to pattern the outer electrodes. An alternative approach would be to tape cast the PZT (a process used for the fabrication of printed circuit boards and multi-layer capacitors). One layer of tape would have the electrodes screen printed with the desired electrode pattern, followed by laying the second PZT tape on top. The entire structure could then be fired to remove organic material in the PZT and center electrode and to densify the structure. The bimorph would then have the outer electrodes patterned, followed by poling and dicing to the desired shape. For example, a PZT tape having dimensions of approximately 2"×3"×0.002" could yield approximately 2880 bimorph actuators.

Figure 6:
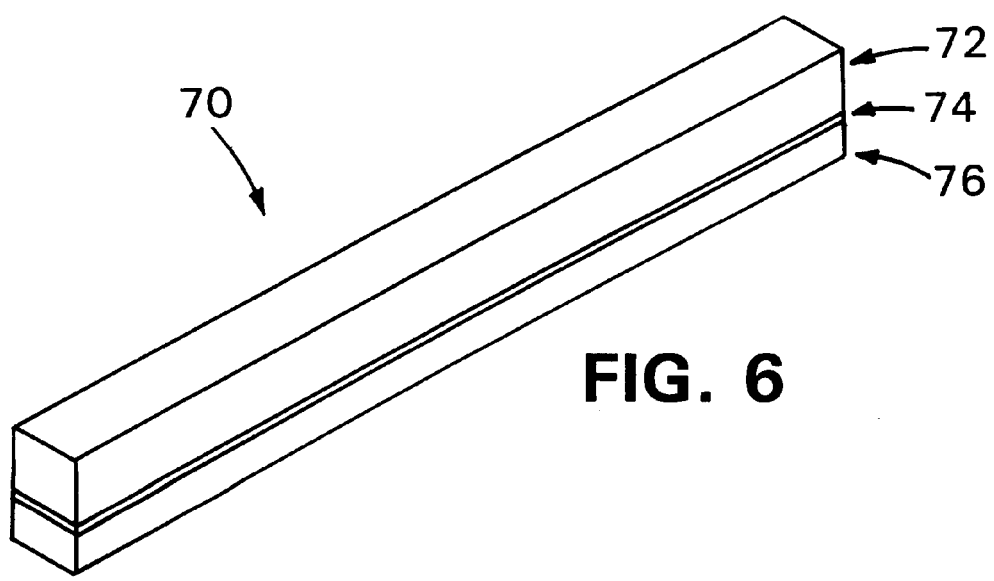
FIG. 6 illustrates a piezoelectric microactuator in a monomorph configuration.

FIG. 6 illustrates a piezoelectric microactuator 70 in a monomorph or unimorph configuration. The microactuator 70 consists of a single layer of PZT 72 attached with conductive epoxy 74 to a metal layer 76. The metal layer 76 may be of any material depending on the stiffness desired, for example, stainless steel. One or more of such monomorph actuators may be connected between the slider and gimbal as discussed above, to microposition the transducer of the slider.

Several embodiments and methods for processing an actuator for micropositioning a disc drive head according to the invention have been described, and it will be understood that various modifications may be made without departing from the spirit and scope of the invention. For example, techniques other than the described methods for processing the piezoelectric actuator could be used.

What is claimed is:

1. An assembly for micropositioning a disc drive head, comprising:
   a gimbal;
   a piezoelectric element in a beam configuration having a first surface and a second surface bonded to the gimbal, and electrically connected to a voltage source wherein the beam includes a first end and a second end; and
   a slider bonded to the piezoelectric element solely at the first and second ends.

2. The apparatus of claim 1, further comprising at least a second piezoelectric element bonded to the gimbal and connected solely at first and second ends of the second piezoelectric element to the slider.

3. The apparatus of claim 1, wherein the piezoelectric element is made of PZT.

4. The apparatus of claim 3, wherein the piezoelectric element is a monomorph having a layer of PZT bonded to a metal layer.

5. The apparatus of claim 3, wherein the piezoelectric element is a bimorph having an inner electrode sandwiched between a first layer and a second layer of PZT.

6. The apparatus of claim 5, wherein the first and second PZT layers are polled in opposite directions.

7. The apparatus of claim 5, wherein the first and second PZT layers are polled in the same direction.

8. The apparatus of claim 5, further comprising a first outer electrode connected to the first layer of PZT and a second outer electrode connected to the second layer of PZT in an offset configuration to permit a two wire connection.

9. The apparatus of claim 1, wherein only the approximate middle of the second surface of the piezoelectric element is bonded to the gimbal.

10. A method for producing an assembly for micropositioning a disc drive head, comprising:
    manufacturing at least one piezoelectric actuator in a beam configuration to have dimensions to fit between a slider and a gimbal, the piezoelectric beam having a first surface and a second surface opposite the first surface;
    connecting only a portion near a first end of the beam and a portion near a second end of the beam on the first surface of the piezoelectric actuator to the slider; and
    connecting only a portion near the approximate middle of the second surface of the piezoelectric actuator to the gimbal.

11. The method of claim 10, further comprising connecting at least a second piezoelecric actuator to the slider and to the gimbal.

12. The method of claim 10, wherein the manufacturing step comprises:
    creating a piezoelectric structure for producing a plurality of microactuators by processing bulk PZT material into first and second layers of PZT tape;
    screen printing electrodes onto the first layer of PZT tape; and
    laying the second layer of PZT tape on top of the electrode layer.

13. The method of claim 12, further comprising firing the entire structure to remove organic materials and to densify the structure.

14. The method of claim 12, further comprising polling the layers of PZT material.

15. The method of claim 12, further comprising dicing the structure to create microactuators of a desired size and shape.

16. The method of claim 12, further comprising:
    patterning first and second outer layers of electrodes;
    connecting the first outer electrode layer to the first layer of PZT tape; and
    connecting the second outer electrode layer to the second layer of PZT tape.

* * * * *